(12) United States Patent
De Graaf et al.

(10) Patent No.: US 8,496,852 B2
(45) Date of Patent: Jul. 30, 2013

(54) PHOSPHOR IN POLYCRYSTALLINE CERAMIC STRUCTURE AND A LIGHT-EMITTING ELEMENT COMPRISNG SAME

(75) Inventors: Jan De Graaf, Eindhoven (NL); Theo Arnold Kop, Amsterdam (NL)

(73) Assignee: Philips Koninklijke N.V., Eindhoven (NL)

(*) Notice: Subject to any disclaimer, the term of this patent is extended or adjusted under 35 U.S.C. 154(b) by 0 days.

(21) Appl. No.: 12/971,605

(22) Filed: Dec. 17, 2010

(65) Prior Publication Data

US 2011/0181173 A1 Jul. 28, 2011

Related U.S. Application Data

(62) Division of application No. 11/908,134, filed as application No. PCT/IB2006/050753 on Mar. 10, 2006, now Pat. No. 7,879,258.

(30) Foreign Application Priority Data

Mar. 14, 2005 (EP) .................................... 05101942
Jul. 7, 2005 (EP) .................................... 05106175

(51) Int. Cl.
*C09K 11/00* (2006.01)
(52) U.S. Cl.
USPC ..... 252/301.4 R; 313/503; 257/98; 264/1.22; 264/2.6; 264/604
(58) Field of Classification Search
USPC ...... 252/301.4 R; 313/503; 257/98; 264/1.22, 264/2.6, 604
See application file for complete search history.

(56) References Cited

U.S. PATENT DOCUMENTS

| 5,847,507 A | 12/1998 | Butterworth et al. |
| 6,246,744 B1 | 6/2001 | Duclos et al. |
| 6,642,618 B2 | 11/2003 | Yagi et al. |
| 6,703,780 B2 * | 3/2004 | Shiang et al. ................. 313/504 |
| 6,734,465 B1 * | 5/2004 | Taskar et al. ................... 257/80 |
| 2002/0021085 A1 | 2/2002 | Ng |
| 2002/0030194 A1 | 3/2002 | Camras et al. |
| 2002/0084748 A1 | 7/2002 | Ayala et al. |
| 2004/0079957 A1 | 4/2004 | Andrews et al. |
| 2006/0124951 A1 | 6/2006 | Sakata et al. |

FOREIGN PATENT DOCUMENTS

| DE | 10349038 | 5/2005 |
| EP | 0062993 A1 | 10/1982 |
| EP | 0816537 A2 | 1/1998 |
| EP | 1369935 A1 | 12/2003 |
| EP | 1566848 A1 | 8/2005 |
| EP | 1577958 A1 | 9/2005 |
| EP | 1588991 | 10/2005 |
| JP | 2002201468 | 7/2002 |
| JP | 2003243717 | 8/2003 |
| WO | 2004/065324 | 8/2004 |

* cited by examiner

*Primary Examiner* — Carol M Koslow

(57) ABSTRACT

The invention relates to a phosphor in a polycrystalline ceramic structure and a light-emitting element provided with the same comprising a Light-Emitting Diode (LED) in which a composite structure of phosphor particles is embedded in a matrix, characterized in that the matrix is a ceramic composite structure comprising a polycrystalline ceramic alumina material, hereafter called luminescent ceramic matrix composite. This luminescent ceramic matrix composite can be made by the steps of converting a powder mixture of ceramic phosphor particles and alumina particles into a slurry, shaping the slurry into a compact, and applying a thermal treatment, optionally in combination with hot isostatic pressing into a polycrystalline phosphor-containing ceramic alumina composite structure. The luminescent ceramic matrix composite further allows a method of tuning the light-diffusing properties by changing at least one of the fractions of phosphor particles and second ceramic particles, the grain size of the particles of the ceramic composite structure, the difference in the refractive index of the particles of the ceramic composite structure, and the porosity in the polycrystalline phosphor-containing ceramic composite structure.

6 Claims, 4 Drawing Sheets

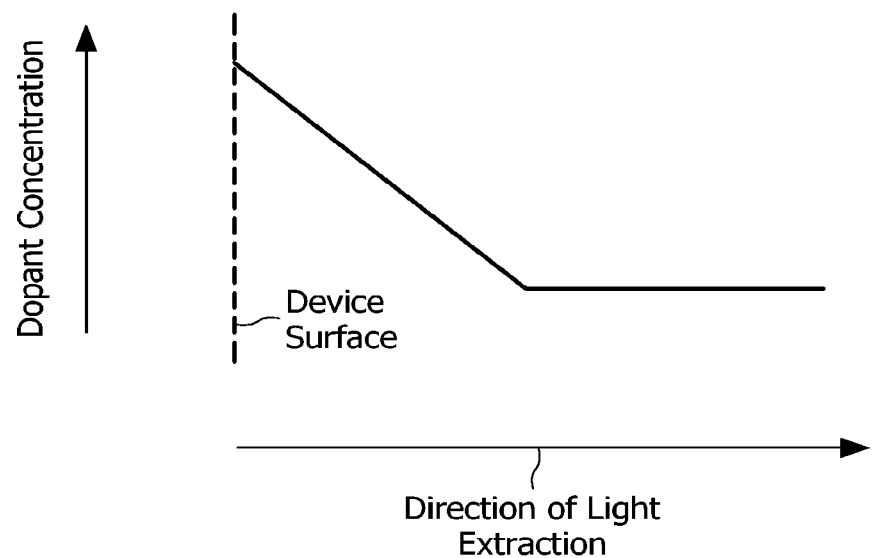
FIG. 4
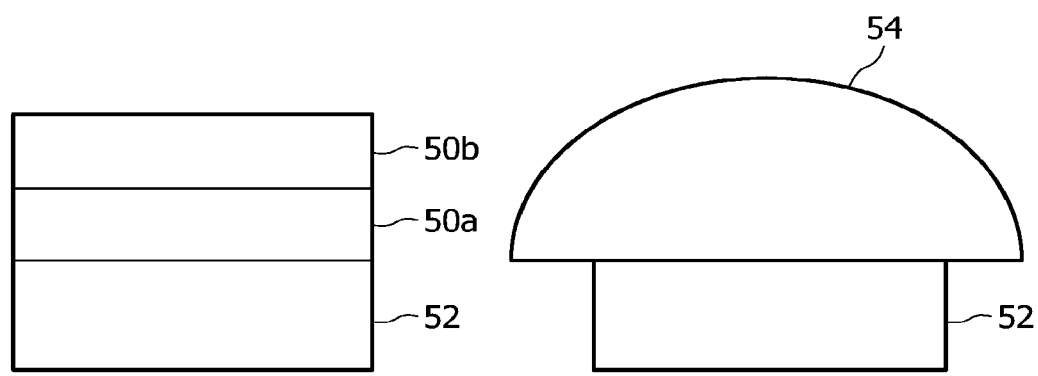
FIG. 5
FIG. 6

PHOSPHOR IN POLYCRYSTALLINE CERAMIC STRUCTURE AND A LIGHT-EMITTING ELEMENT COMPRISNG SAME

The present invention relates to a phosphor in a polycrystalline ceramic structure, to a light-emitting element comprising a light-emitting diode provided with said phosphor, to a method of making the same, and to a method of tuning the light-diffusing and the light-emitting properties of the phosphor.

Such a phosphor in a polycrystalline ceramic structure forms a luminescent ceramic composite.

State of the art high-brightness white-light LEDs (light-emitting diodes) face limitations. The phosphor layer which is deposited on the LED causes a light loss due to back scattering of light into the LED. Backscatter losses are commonly 20-30%. Furthermore, the heat transfer from the LED and the phosphor is an issue for high-power applications where the junction temperature and the phosphor temperature become high and the optics (phosphor encapsulant and extraction lens) effectively insulate the LED. Commonly used encapsulant matrices are made of silicones and/or epoxy resins, but these materials have a very low heat conductivity, suffer from a less than optimal coupling-out of light due to the mismatch in refractive index of the matrix and the LED materials, and are limited in their photo-thermal stability.

JP 2003-243717 describes a ceramic substrate mounted on a surface of a light-emitting diode. The ceramic substrate is translucent in a visible light region and comprises YAG (Yttrium-Aluminum-Garnet) phosphors. According to this patent publication, the secular change and dispersion of the luminous color and emission quantity can be suppressed as compared with a conventional case where resin is the base material. This patent publication is silent on the nature of the matrix materials and the specific conditions required for the base materials to avoid back scattering of blue LED light.

DE 10349038 discloses a material mainly formed by a phosphor (i.e. Ce-doped YAG), which acts as the ceramic base material. A small amount of alumina may be present in the basic material as foreign crystals. The grain size of the ceramic material and foreign crystals is 1 to 100 μm. The disclosed material has various disadvantages. Only the pores and the foreign crystals can contribute to forward scattering, which is necessary for obtaining the desired color homogeneity. These pores and foreign crystals, however, also lead to back scattering. Disadvantages of the use of YAG:Ce as the basic material are its lower heat conduction coefficient and the high cost of the material and of the process for its manufacture.

It is an object of the present invention to alleviate these problems and disadvantages and to obtain an improved light-emitting element. It has been found that the above problems could efficiently be solved by using a phosphor of the doped YAG type, wherein the phosphor is embedded in a ceramic matrix comprising a non-luminescent polycrystalline alumina that forms a ceramic matrix composite, which ceramic matrix composite comprises 80 to 99.99 vol. % alumina and 0.01 to 20 vol. % phosphor.

The term phosphor in this invention has the ordinary meaning of a material having luminescent properties.

Other LEDs comprising phosphors embedded in a matrix have been disclosed in, for example, EP 1369935. However, the phosphor particles 22 are typically embedded in an epoxy or silicone host material 20 that is disposed over the top 16 and sides of LED 12, as illustrated in FIG. 1. Phosphor embedded in epoxy or silicone host material still suffers from the above-mentioned and other disadvantages.

The presently claimed phosphor in polycrystalline ceramic structure and light-emitting elements (LEEs) comprising such a phosphor as a luminescent ceramic composite, i.e. polycrystalline ceramic composites of garnet phosphors (such as YAG:Ce) embedded in a matrix of polycrystalline alumina, have not been described in the prior art.

The main function of the luminescent materials is to convert part of the blue light and to transmit the other part so as to yield the required white emission. Typical dimensions and material compositions for the new luminescent ceramics that yield proper white emission are combinations of a LED with a luminescent ceramic substrate on top with a thickness of 200-1000 microns and a phosphor volume percentage somewhere in the range of, for example, about 15 to 7 vol. % $Y_{2.94}Ce_{0.06}Al_5O_{12}$ down to, for example, about 3 to 1.4 vol. % $Y_{2.7}Ce_{0.3}Al_5O_{12}$. For high-luminance phosphor converted LEDs, a thin conformal luminescent cup with a wall thickness of down to 50 microns and a percentage by volume of YAG of down to 12 vol. % $Y_{2.7}Ce_{0.3}Al_5O_{12}$ yields a proper white emission.

The new polycrystalline ceramic composites of the present invention offer solutions to general optical and photo-thermal problems occurring with phosphor converted LEDs. The following are some of the advantages of the present invention, including advantages as regards the optical properties, the thermal properties, and the processing of these new materials over matrices comprising other basic materials described in the prior art.

Thermally:

The power dissipation in light-emitting diodes is a factor of high importance. The operation of a light-emitting diode is a function of its temperature, and the device efficacy decreases with an increase in device temperature. Dissipation of heat generated in the phosphors by Stokes-shift losses is important since the phosphor efficiency drops with an increase in temperature. This aspect is of particular importance for high-power and high-brightness LED light sources.

The heat conductivity of pure $Al_2O_3$ (alumina) is higher than that of YAG (35 vs. 15 W/mK). The heat conductivity of the present composites, therefore, is higher than that of the ceramic materials of DE 10349038 that has YAG as the basic material. As a result, a luminescent ceramic composite and thus also light-emitting element is obtained with better heat dissipation to the surroundings, leading to lower phosphor and diode temperatures and consequently resulting in higher luminous fluxes with the invented composites at the same power or the same luminous fluxes at lower power Optically:

The importance of mastering the scattering of light in the luminescent material is well recognized (see for example EP 1369935). Light scatter is functional in realizing a uniform angular spectral emission from LEDs and ceramic combinations (i.e., the LEE), but a high degree of light scatter is detrimental due to in particular backscatter losses of light that is being reabsorbed by the LED itself. It was found that with a volume of the phosphor of at most 20 vol. % the backscatter losses can be kept to a reduced level well below the 20 to 30% range commonly known for prior art phosphor layers.

The scattering of light in a phosphor in an embedded system such as epoxy or silicone depends inter alia on the refractive index mismatch between the phosphor material and the epoxy or silicone. The amount of phosphor particles and their size have to be chosen such that the path length through the compact is so long that enough blue light is converted into yellow and so short that an adequate amount of blue light is passed through the embedded phosphor layer. The resultant light scattering does not only scatter light in the forward direction but also backwards. The backscattered light has a considerable chance of being reabsorbed in the LED. This decreases the efficiency. In DE 10349038 the epoxy is replaced by a transparent ceramic matrix. It is stated that color homogeneity can be achieved by introducing pores or second phases that introduce light scattering. Especially pores, however, will also lead to backscatter and thus to a reduced efficiency. An advantageous aspect of the present invention is the possibility to reduce the backscatter losses in the luminescent material by primarily restricting the fraction of YAG:Ce in alumina to about 20 vol. %. A further improvement is achieved by controlling the porosity and the pore size distribution. In an advantageous embodiment, the ceramic composite has a porosity of at most about 1%. Furthermore, the pore sizes should be kept small, for example smaller than 300 nm, preferably smaller than about 100 nm. Best results are achievable with a pore sizes below 50 nm.

In combination with the limitation of the YAG fraction it is possible to arrive at backscatter losses as low as 5%.

Taking alumina as the matrix for the phosphor particles leads to an additional advantage in tuning the color homogeneity of the light-emitting element without introducing backscattering. Due to the hexagonal crystal structure of alumina, and the small difference in the indices of refraction in the two main directions, light will be refracted at the grain boundaries, i.e. be diffused, while the reflected or backscatter component is at least an order of magnitude smaller than the forward diffusion ability. Thus the use of polycrystalline alumina as the matrix material will further improve the efficiency of the luminescent ceramic composite and consequently of the light-emitting element provided therewith. The forward scatter and surface structuring of the materials is used to obtain an improved homogeneity in color. To this end it was found to be advantageous that the average grain size of the grains comprised in the ceramic matrix is 0.3-50 μm Color Point and Color Temperature:

A certain amount of Ce is needed for a certain degree of blue conversion. The emission spectrum of YAG:Ce depends on the Ce concentration in the YAG lattice. Compared with the other lattices, where the activator ion (Ce or Pr) is introduced by diffusion and a homogeneous concentration in the matrix is obtained, the present composite makes it possible to have a high Ce concentration locally in the phosphor powder (YAG:Ce) with respect to the concentration of the same total amount of Ce according to DE 10349038. Thus high concentrations of Ce are possible while maintaining a low overall concentration. This gives an additional degree of freedom in optimizing the color point and color temperature. It may also be convenient in assembling the LED device, since sheets thicker than those of conformal phosphor layers (typically 30 microns), which are easier to handle, can be applied.

Processing:

Preparing transparent YAG-bodies is difficult, since YAG is a line compound and often an aluminum- or yttrium-rich phase will be found next to the intended YAG phase. Alumina processing, however, is well controlled. Alumina is also cheaper than YAG. Furthermore, translucent alumina can be made at a relatively low temperature. The above-mentioned devices with thin-film or conformal phosphor layers can be difficult to handle because the phosphor layers tend to be fragile. In accordance with embodiments of the invention, wavelength-converting layers are formed from phosphors in an alumina matrix, forming luminescent ceramic matrix composites. The luminescent ceramic matrix composites are generally self-supporting layers formed separately from the semiconductor device, which are then attached to the finished semiconductor device or used as a growth substrate for the semiconductor device. The ceramic matrix composite layers may be translucent or transparent, which reduces the scattering losses associated with non-transparent wavelength-converting layers such as conformal layers Luminescent ceramic matrix composite layers may be more robust than thin-film or conformal phosphor layers. In addition, since luminescent ceramic matrix composite layers are solid, it may be easier to make optical contact to additional optical elements such as lenses and secondary optics, which are also solid.

The phosphors used according to the invention are of the YAG type (yttrium aluminum garnet). Examples of phosphors that may be formed into luminescent ceramic matrix composite layers include YAG phosphors with the general formula $(Lu_{1-x-y-a-b}Y_xGd_y)3(Al_{1-z}Ga_z)_5O_{12}:Ce_aPr_b$ wherein $0<x\leq1; 0\leq y<1; 0\leq z\leq0.1; 0\leq a\leq0.2, 0\leq b\leq0.1$; and $a+b>0$, such as $Lu_3Al_5O_{12}:Ce^{3+}$ and $Y_3Al_5O_{12}:Ce^{3+}$, which emit light in the green-yellow range. Suitable $Y_3Al_5O_{12}:Ce^{3+}$ ceramic materials may be purchased from Baikowski International Corporation of Charlotte, N.C.

A luminescent ceramic matrix composite may be formed by a process comprising the steps of forming a slurry of alumina and phosphor powder, shaping the slurry into a powder compact, and applying a thermal treatment, optionally in combination with hot isostatic pressing into a polycrystalline phosphor-containing alumina ceramic composite structure having minimum backscatter. The slurry may be shaped by means of slip casting or injection molding so as to obtain a ceramic light-converting package, a collimating lens or collimating reflector, a coupling-out structure for light, or a heat-dissipating device. The ceramic material comprises 80 to 99.99 vol. % alumina and 0.01 to 20 vol. % of the phosphor. More preferably the ceramic material comprises 90 to 99.9 vol. % alumina and 1 to 5 vol. % of the phosphor. The sum of alumina and phosphor is not necessarily 100 vol. %, but may be lower if small amounts of the other metals, alloys, inorganic compounds, and the like are present. To obtain transparent LEEs, it is further preferred to make ceramic particles having an average size between 0.3 and 50 μm, preferably between 20 and 40 μm.

The process comprises the mixing of an alumina and phosphor powder, optionally with stabilizers and binders, and the subsequent shaping of a powder compact. The powder compact is subsequently heated to remove the organic binders and to achieve densification of the compact. The resulting object has a high translucency and wavelength-converting properties. Unlike conventional conformal phosphor layers or phosphor layers disposed in a transparent resin, the polycrystalline alumina phosphor composite is substantially free of organic material (less than 1%).

The light-diffusing properties of the polycrystalline ceramic structure can be tuned by changing at least one of the following: the fractions of phosphor and alumina in the polycrystalline ceramic structure, the average particle size of the particles in the polycrystalline ceramic structure, and the porosity of the polycrystalline ceramic structure. The light-emission properties of the polycrystalline ceramic structure can be tuned by changing at least one of the following: the fractions of phosphor and alumina in the polycrystalline ceramic structure, the ratio of Ce and/or Pr to YAG in the phosphor, and the composition of YAG.

Luminescent ceramic matrix composite elements may be attached to light-emitting devices by, for example, wafer bonding, sintering, gluing with thin layers of known organic adhesives such as epoxy or silicone, gluing with high-index inorganic adhesives, and gluing with sol-gel glasses.

Examples of high index adhesives include high index optical glasses such Schott glass SF59, Schott glass LaSF 3, Schott glass LaSF N18, and mixtures thereof. These glasses are available from Schott Glass Technologies Incorporated, of Duryea, Pa. Examples of other high index adhesives include high index chalcogenide glass, such as (Ge,Sb,Ga)(S, Se) chalcogenide glasses, III-V semiconductors including but not limited to GaP, InGaP, GaAs, and GaN, II-VI semiconductors including but not limited to ZnS, ZnSe, ZnTe, CdS, CdSe, and CdTe, group IV semiconductors and compounds including but not limited to Si and Ge, organic semiconductors, metal oxides including but not limited to tungsten oxide, titanium oxide, nickel oxide, zirconium oxide, indium-tin oxide, and chromium oxide, metal fluorides including but not limited to magnesium fluoride and calcium fluoride, metals including but not limited to Zn, In, Mg, and Sn, YAG, phosphide compounds, arsenide compounds, antimonide compounds, nitride compounds, high-index organic compounds, and mixtures or alloys thereof.

Gluing with sol-gel glasses is described in more detail in U.S. Pat. No. 6,642,618, which is incorporated herein by reference. In embodiments where the luminescent ceramic matrix composite is attached to the device by a sol-gel glass, one or more materials such as oxides of titanium, cerium, lead, gallium, bismuth, cadmium, zinc, barium, or aluminum may be included in the $SiO_2$ sol-gel glass to increase the refractive index of the glass in order to more closely match the index of the glass with the indices of the luminescent ceramic matrix composite and the light-emitting device. For example, a $Y_3Al_5O_{12}$:$Ce^{3+}$ in alumina ceramic layer may have a refractive index of about 1.76, and may be attached to a sapphire growth substrate of a semiconductor light-emitting device, which sapphire substrate has a refractive index of 1.76. It is desirable to match the refractive index of the adhesive to the refractive indices of the $Y_3Al_5O_{12}$:$Ce^{3+}$ ceramic layer and the sapphire growth substrate.

Luminescent ceramic matrix composite elements may include a single phosphor or multiple phosphors mixed together. In some embodiments, the degree of phosphor concentration in the ceramic layer is graded. The structures allow easy tuning of the light-diffusing properties of the LED by changing at least one of the fractions of phosphor particles and ceramic alumina particles, the grain size of the particles of the ceramic composite structure, and the porosity in the polycrystalline phosphor-containing ceramic composite structure.

In some embodiments, devices may include multiple ceramic elements.

An additional advantage of the present luminescent ceramic matrix composite element is the ability to mold, grind, machine, hot stamp or polish the ceramic elements into shapes that are desirable, for example as layers, for increased light extraction Luminescent ceramic matrix composite elements generally have high refractive indices, for example 1.75 to 1.8 for a $Y_3Al_5O_{12}$:$Ce^{3+}$ ceramic element. In order to avoid total internal reflection at the interface between the high-index ceramic element and low-index air, the ceramic element may be shaped into a lens such as a dome lens. Light extraction from the device may be further improved by texturing the top of the ceramic element, either randomly or, for example, into a Fresnel lens shape. In some embodiments the top of the ceramic element may be textured with a photonic crystal structure, such as a periodic lattice of holes formed in the ceramic material. The shaped ceramic element may be smaller than or the same size as a face of a device to which it is attached, or it may be larger than the face of the device to which it is attached. In some devices favorable light extraction is expected for shaped ceramic elements having a bottom length at least twice the length of the face of the device on which the ceramic element is mounted. In some embodiments, the wavelength-converting material is confined to the portion of the ceramic element closest to the device. In other embodiments the wavelength-converting material is provided in a first luminescent ceramic matrix composite layer and then attached to a second, shaped, transparent ceramic element. In other embodiments the color homogeneity of the light-emitting element is assured through shaping of the luminescent ceramic matrix composite.

In some embodiments, the surface of the top ceramic element is roughened to increase scattering necessary for mixing the light, for example in a device where light from the light-emitting device and one or more wavelength-converting elements mixes to form white light. In other embodiments, sufficient mixing may be accomplished by secondary optics, such as a lens or optical waveguide, as is known in the art.

A further advantage of luminescent ceramic matrix composite elements lies in the favorable thermal properties of ceramics, including a transparent or luminescent ceramic matrix composite element that is shaped for light extraction. An optional additional transparent or luminescent ceramic matrix composite element may be disposed between the element and a device. The device may be mounted on a submount, for example as a flip chip. Submount and host substrate, may be, for example, metals such as Cu foil, Mo, Cu/Mo, and Cu/W; semiconductors with metal contacts, such as Si with ohmic contacts and GaAs with ohmic contacts including, for example, one or more Pd, Ge, Ti, Au, Ni, Ag contacts; and ceramics such as compressed diamond. Layers may be thermally conductive materials that connect the ceramic element to the submount, potentially reducing the temperature of luminescent ceramic matrix composite elements and thereby increasing light output. Materials suitable for submount elements include the submount materials described above.

The invention is further illustrated by the following non-limitative examples and Figures.

FIG. 4 illustrates an example of a phosphor doping profile in a luminescent ceramic matrix composite layer.

FIG. 5 illustrates a semiconductor light-emitting device including multiple ceramic layers.

FIG. 6 illustrates a semiconductor light-emitting device including a shaped luminescent ceramic matrix composite layer.

Figure 2:
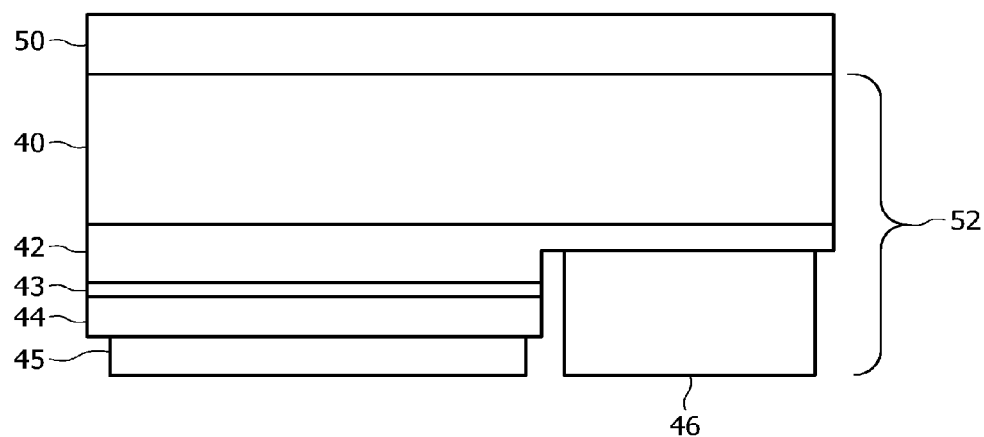
FIG. 2 illustrates a flip chip semiconductor light-emitting device including a polycrystalline alumina-phosphor composite layer, i.e. a luminescent ceramic matrix composite.
Figure 3:
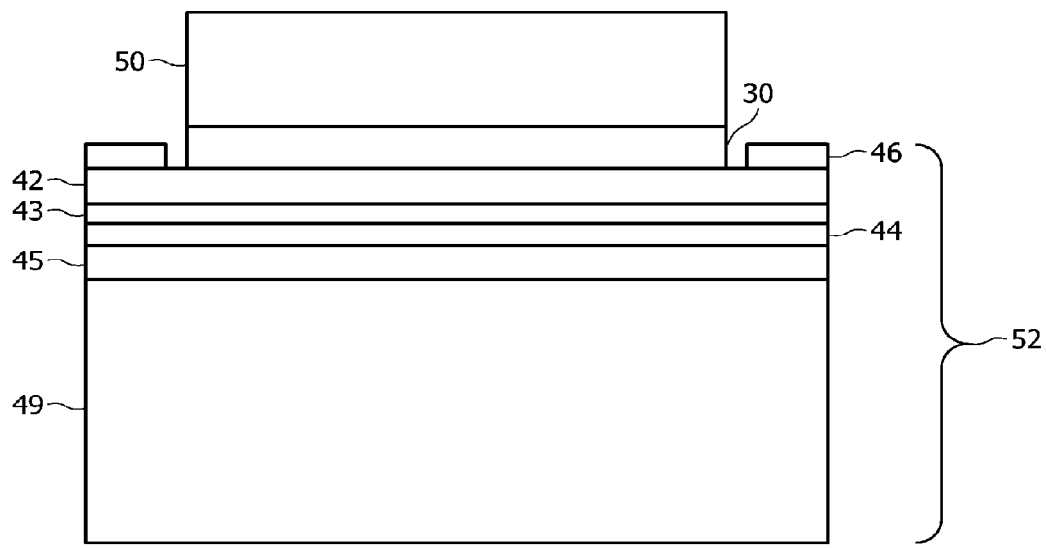
FIG. 3 illustrates a semiconductor light-emitting device including a bonded host substrate and a luminescent ceramic matrix composite.

FIGS. 2 and 3 illustrate devices including luminescent ceramic matrix composite layers. In the device of FIG. 2, an n-type region 42 is grown over a suitable growth substrate 40, followed by an active region 43 and a p-type region 44. The growth substrate 40 may be, for example, sapphire, SiC, GaN, or any other suitable growth substrate. Each of the n-type region 42, active region 43, and p-type region 44 may include multiple layers of different composition, thickness, and dopant concentration. For example, n-type region 42 and p-type region 44 may include contact layers optimized for ohmic contact and cladding layers optimized to contain carriers within active region 43. Active region 43 may include a single light-emitting layer, or may include multiple quantum well light-emitting layers separated by barrier layers.

In the device illustrated in FIG. 2, a portion of p-type region 44 and of active region 43 is etched away to reveal a portion of n-type region 42. A p-contact 45 is formed on the remaining portion of p-type region 44 and an n-contact 46 is formed on the exposed portion of n-contact 46. In the embodiment illustrated in FIG. 2, contacts 45 and 46 are reflective such that light is extracted from the device through the back of substrate 40. Alternatively, the contacts 45 and 46 may be transparent or formed such that a large portion of the surfaces of p-type region 44 and n-type region 42 is left uncovered by contacts. In such devices, light may be extracted from the device through the top surface of the epitaxial structure, i.e. the surface on which contacts 45 and 46 are formed.

In the device illustrated in FIG. 3, the epitaxial layers are bonded to a host substrate 49 through p-contact 45. Additional layers to facilitate bonding (not shown) may be included between p-type region 44 and host 49. After the epitaxial layers are bonded to host 49, the growth substrate may be removed to expose a surface of n-type region 42. Contact to the p-side of the active region is provided through host 49. An n-contact 46 is formed on a portion of the exposed surface of n-type region 42. Light is extracted from the device through the top surface of n-type region 42.

In the devices illustrated in FIGS. 2 and 3, a luminescent ceramic matrix composite layer 50 such as the ceramic layers described above is attached to the surface of the device from which light is extracted; the back of substrate 40 in FIG. 2 and the top of n-type region 42 in FIG. 3. The ceramic layer 50 may be formed on or attached to any surface from which light is extracted from the device. For example, ceramic layer 50 may extend over the sides of the device illustrated in FIG. 2. FIG. 3 illustrates an optional filter 30, which allows light from active region 43 to pass into ceramic layer 50, but reflects light emitted by ceramic layer 50, such that light emitted by ceramic layer 50 is inhibited from entering device 52, where it is likely to be absorbed and lost. Examples of suitable filters include dichroic filters available from Unaxis Balzers Ltd. of Liechtenstein or Optical Coating Laboratory, Inc. of Santa Rosa, Calif.

The luminescent ceramic matrix composite layer 50 may include a single phosphor or multiple phosphors mixed together. In some embodiments, the amount of activating dopant in the ceramic layer is graded. FIG. 4 illustrates an example of a graded doping profile in a luminescent ceramic matrix composite layer. The dashed line in FIG. 4 represents the surface of the device. The phosphor in the portion of the ceramic layer closest to the device surface has the highest dopant concentration. As the distance from the device surface increases, the dopant concentration in the phosphor decreases. Though a linear dopant profile with a region of constant dopant concentration is shown in FIG. 4, it is to be understood that the grading profile may take any shape including, for example, a stepwise graded profile or an exponential profile, and may include multiple or no regions of constant dopant concentration. In addition, in some embodiments it may be advantageous to reverse the grading profile, such that the region closest to the device surface has a low dopant concentration that increases as the distance from the device surface increases. In some embodiments, the portion of the ceramic layer furthest from the device surface is not allowed to contain any phosphor or any dopant and may be shaped (as shown below) for light extraction.

Figure 1:
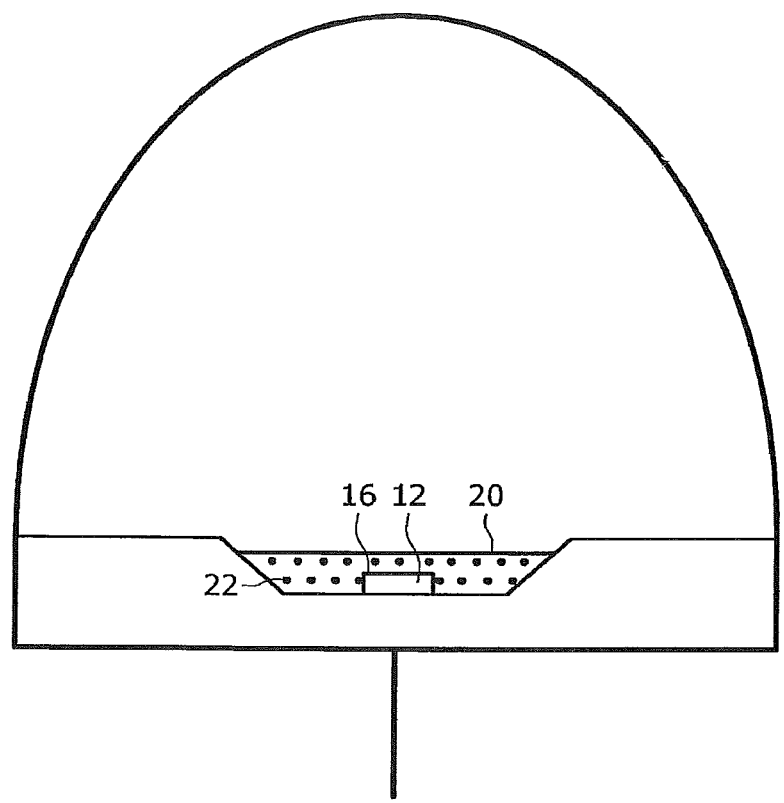
FIG. 1 illustrates a prior art phosphor-converted semiconductor light-emitting device.

In some embodiments, devices include multiple ceramic layers, as in the device illustrated in FIG. 5. Ceramic layer 50*a* is attached to device 52, which may be, for example, either of the devices illustrated in FIGS. 2 and 3. Ceramic layer 50*b* is attached to ceramic layer 50*a*. In some embodiments, one of the two ceramic layers 50*a* and 50*b* contains all the wavelength converting materials used in the device, and the other of the two ceramic layers is transparent and used as a spacer layer, if it is the ceramic layer adjacent to device 52, or as a light extraction layer, if it is the ceramic layer furthest from device 52. In some embodiments, each of ceramic layers 50*a* and 50*b* may contain a different phosphor or phosphors. Though two ceramic layers are illustrated in FIG. 5, it is to be understood that devices including more than two ceramic layers and/or more than two phosphors are within the scope of the invention. The arrangement of the different phosphors in ceramic layers 50*a* and 50*b* or ceramic layers 50*a* and 50*b* themselves may chosen to control the interaction between the multiple phosphors in a device. Though ceramic lavers 50*a* and 50*b* are shown stacked over device 52 in FIG. 5, other arrangements are possible and within the scope of the invention. In some embodiments, a device including one or more ceramic layers may be combined with other wavelength converting layers, such as the wavelength converting material shown in FIG. 1, or thin films, conformal layers, and luminescent substrates. Transparent ceramic layers that are not luminescent may be, for example, the same host material as the luminescent ceramic layer, without the activating dopant.

Figure 7:
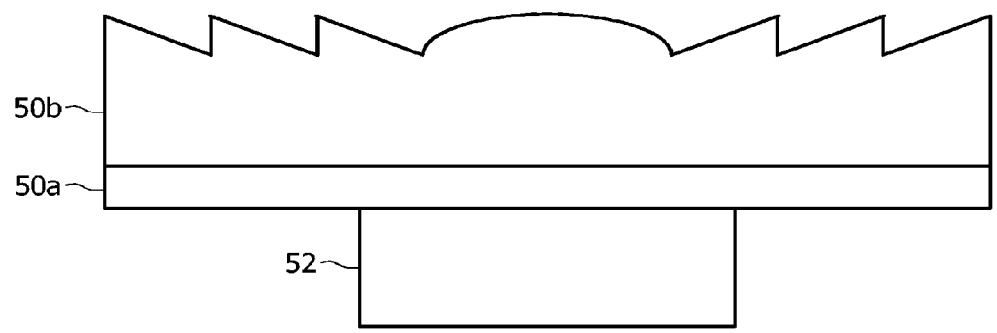
FIG. 7 illustrates a semiconductor light-emitting device including a ceramic phosphor layer wider than the epitaxial layers in the device.

An advantage of luminescent ceramic matrix composite layers is the ability to mold, grind, machine, hot stamp or polish the ceramic layers into shapes that are desirable, for example, for increased light extraction Luminescent ceramic matrix composite layers generally have high refractive indices, for example 1.75 to 1.8 for a $Y_3Al_5O_{12}:Ce^{3+}$ ceramic layer. In order to avoid total internal reflection at the interface between the high-index ceramic layer and low-index air, the ceramic layer may be shaped as illustrated in FIGS. 6 and 7. In the device illustrated in FIG. 6, the luminescent ceramic matrix composite layer 54 is shaped into a lens such as a dome lens. Light extraction from the device may be further improved by texturing the top of the ceramic layer, either randomly or, for example, into a Fresnel lens shape as illustrated in FIG. 7. In some embodiments the top of the ceramic layer may be textured with a photonic crystal structure, such as a periodic lattice of holes formed in the ceramic material. The shaped ceramic layer may be smaller than or the same size as the face of device 52 to which it is attached or it may be larger than the face of device 52 to which it is attached, as illustrated in FIGS. 6 and 7. In devices such as FIG. 7, favorable light extraction is expected for shaped ceramic layers having a bottom length at least twice the length of the face of device 52 on which the ceramic layer is mounted. In some embodiments, the wavelength-converting material is confined to the portion of the ceramic layer closest to the device 52. In other embodiments, as illustrated in FIG. 7, the wavelength-converting material is provided in a first ceramic layer 50*a* and is then attached to a second, shaped, transparent ceramic layer 50*b*.

In some embodiments, the surface of the top ceramic layer is roughened to increase scattering necessary for mixing the light, for example in a device where light from the light-emitting device and one or more wavelength-converting layers mixes to form white light. In other embodiments, sufficient mixing may be accomplished by secondary optics such as a lens or optical waveguide, as is known in the art.

Figure 8:
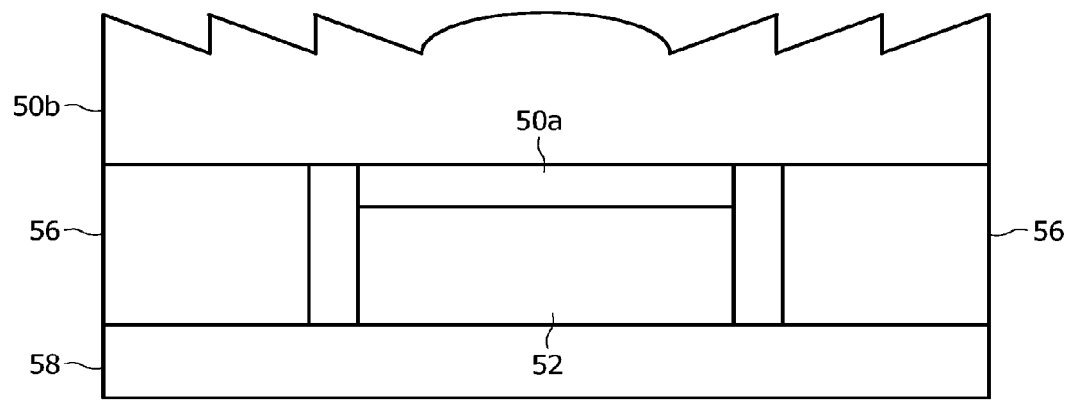
FIG. 8 illustrates a semiconductor light-emitting device including a ceramic phosphor layer and a heat extraction structure.

A further advantage of luminescent ceramic matrix composite layers lies in the favorable thermal properties of ceramics. A device including a luminescent ceramic matrix composite layer and a heat extraction structure is illustrated in FIG. 8. As in FIG. 7, FIG. 8 shows a transparent or luminescent ceramic matrix composite layer 50b that is shaped for light extraction. An optional additional transparent or luminescent ceramic matrix composite layer 50a is disposed between layer 50b and device 52. Device 52 is mounted on a submount 58, for example as a flip chip as illustrated in FIG. 2. Submount 58 and host substrate 49 of FIG. 3, may be, for example, metals such as Cu foil, Mo, Cu/Mo, and Cu/W; semiconductors with metal contacts, such as Si with ohmic contacts and GaAs with ohmic contacts including, for example, one or more of Pd, Ge, Ti, Au, Ni, Ag; and ceramics such as compressed diamond. Layers 56 are thermally conductive materials that connect ceramic layer 50b to submount 58, potentially reducing the temperature of luminescent ceramic matrix composite layer 50a and/or 50b and thereby increasing light output. Materials suitable for layers 56 include the submount material described above. The arrangement illustrated in FIG. 8 is particularly useful for extracting heat from flip chip devices with conductive substrates, such as SiC.

EXAMPLE

A powder consisting of fine and well dispersible alumina particles (e.g. Taimei TM-DAR, Sumitomo AKP50) was mixed with a YAG:Ce type powder (ex Philips Lighting) dispersed into water by deagglomeration (e.g., by wet ball milling or ultrasound, etc.) and stabilization (e.g. by using $HNO_3$ or polyacrylic acid) of the alumina particles. The alumina suspension was cast (e.g., by slipcasting, injection molding, or gelcasting) into molds.

After drying and unmolding, the porous alumina product was calcinated in oxygen to remove all undesired components (such as stabilizers and binders) at a temperature substantially below the sintering temperature. Subsequently, the material was sintered in a suitable sintering atmosphere (e.g. under vacuum or oxygen atmosphere) until the density was higher than 95%. After the sintering treatment hot isostatic pressing was applied to increase the density further without the need for a higher sintering temperature. The resulting product was highly translucent and showed only limited backscattering.

The invention claimed is:

1. A method of producing a ceramic structure, the method comprising:
    making a polycrystalline ceramic structure comprising a phosphor embedded in a ceramic matrix comprising non-luminescent polycrystalline alumina, wherein the phosphor comprises $(Lu_{1-x-y-a-b}Y_xGd_y)_3(Al_{1-z}Ga_z)_5O_{12}:Ce_aPr_b$ wherein $0<x\leq1$; $0\leq y<1$; $0\leq z\leq0.1$; $0\leq a\leq0.2$; $0\leq b\leq0.1$; and $a+b>0$, the ceramic matrix comprises 80 to 99.99 vol. % alumina and 0.01 to 20 vol. % phosphor, and making a polycrystalline ceramic structure comprises:
    converting a powder of phosphor and alumina particles into a slurry,
    shaping the slurry into a polycrystalline phosphor-containing ceramic alumina composite structure, and
    applying a thermal treatment.

2. The method of producing a ceramic structure according to claim 1, wherein the slurry is shaped into a polycrystalline phosphor-containing ceramic alumina composite structure by means of slip casting or injection molding so as to obtain a ceramic light-converting package, a collimating lens or collimating reflector, a coupling-out structure for light, or a heat-dissipating device.

3. The method of producing a ceramic structure of claim 1 further comprising tuning light-diffusing properties of the polycrystalline ceramic structure by selecting, prior to making the polycrystalline ceramic structure, the average particle size of the particles in the polycrystalline ceramic structure, wherein the average particle size of the particles in the polycrystalline ceramic structure is between 0.3 and 50 μm.

4. The method of producing a ceramic structure of claim 1 further comprising tuning light-diffusing properties of the polycrystalline ceramic structure by selecting, prior to making the polycrystalline ceramic structure, the porosity of the polycrystalline ceramic structure, wherein the porosity of the polycrystalline ceramic structure is no more than 1%.

5. The method of producing a ceramic structure of claim 1 wherein applying a thermal treatment is combined with hot isostatic pressing into the ceramic matrix.

6. A method of producing a light emitting element, the method comprising:
    making a polycrystalline ceramic structure comprising a phosphor embedded in a ceramic matrix comprising non-luminescent polycrystalline alumina, wherein the phosphor comprises $(Lu_{1-x-y-a-b}Y_xGd_y)_3(Al_{1-z}Ga_z)_5O_{12}:Ce_aPr_b$ wherein $0<x\leq1$; $0\leq y<1$; $0\leq z\leq0.1$; $0\leq a\leq0.2$; $0\leq b\leq0.1$; and $a+b>0$, the ceramic matrix comprises 80 to 99.99 vol. % alumina and 0.01 to 20 vol. % phosphor, and making a polycrystalline ceramic structure comprises:
    converting a powder of phosphor and alumina particles into a slurry,
    shaping the slurry into a polycrystalline phosphor-containing ceramic alumina composite structure, and
    applying a thermal treatment; and
    mounting the polycrystalline ceramic structure on a LED.

* * * * *